US006890827B1

United States Patent
Choi et al.

(10) Patent No.: US 6,890,827 B1
(45) Date of Patent: May 10, 2005

(54) METHOD OF FABRICATING A SILICON ON INSULATOR TRANSISTOR STRUCTURE FOR IMBEDDED DRAM

(75) Inventors: Seungmoo Choi, Orlando, FL (US); Sailesh Merchant, Orlando, FL (US); Pradip K. Roy, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 617 days.

(21) Appl. No.: 09/384,503

(22) Filed: Aug. 27, 1999

Related U.S. Application Data
(60) Provisional application No. 60/115,843, filed on Jan. 13, 1999.

(51) Int. Cl.[7] .............................................. H01L 21/331
(52) U.S. Cl. ....................... 438/311; 438/479; 438/491; 438/517; 438/979; 257/347; 257/352
(58) Field of Search ................................ 438/151, 311, 438/517, 514, 478, 479, 491, 488, 237, 149, 979, 962, 152, 144, 243, 387, 700, 155, 190, 210, 239, 242, 329, 397, 386, 381, 359, 244, 248; 257/347, 348, 349, 350, 351, 352, 353, 354, 9, 10, 11, 12, 13, 14

(56) References Cited

U.S. PATENT DOCUMENTS

| | | | | |
|---|---|---|---|---|
| 5,013,681 A | * | 5/1991 | Godbey et al. ............... 437/86 |
| 5,032,529 A | | 7/1991 | Beitman et al. | |
| 5,087,580 A | * | 2/1992 | Eklund ......................... 437/31 |
| 5,240,876 A | * | 8/1993 | Gaul et al. ................... 437/131 |
| 5,670,388 A | | 9/1997 | Machesney et al. | |
| 5,698,869 A | * | 12/1997 | Yoshimi et al. ............. 257/192 |
| 5,773,152 A | * | 6/1998 | Okonogi ..................... 428/446 |
| 5,876,497 A | * | 3/1999 | Atoji ............................ 117/85 |
| 6,051,452 A | | 4/2000 | Shigyo et al. | |
| 6,072,209 A | | 6/2000 | Noble et al. | |
| 6,103,009 A | * | 8/2000 | Atoji ............................ 117/97 |
| 6,140,157 A | * | 10/2000 | Warren et al. ............... 438/149 |
| 6,180,983 B1 | * | 1/2001 | Merrill ......................... 257/347 |
| 6,210,998 B1 | * | 4/2001 | Son ............................. 438/162 |
| 6,221,738 B1 | * | 4/2001 | Sakaguchi et al. .......... 438/455 |
| 6,222,215 B1 | | 4/2001 | Zahurak | |
| 6,255,150 B1 | * | 7/2001 | Wilk et al. ................... 438/191 |
| 6,294,412 B1 | * | 9/2001 | Krivokapic .................. 438/155 |
| 6,323,072 B1 | * | 11/2001 | Yamazaki et al. ........... 438/166 |
| 6,333,532 B1 | | 12/2001 | Davari et al. | |

FOREIGN PATENT DOCUMENTS

JP    62-104172    *    5/1987

OTHER PUBLICATIONS

Kuge et al. "SOI–DRAM circuit tehcnologies for low power high speed multigiga scale memories", Apr. 1996, pp. 586–591. IEEE Journal of Solid–State Circuits.*

Kuge et al. "SOI–DRAM circuit tehcnologies for low power high speed multigiga scale memories", Jun. 1995, pp. 103–104. Symposium on Digest of Technical PapersVLSI Circuits, 1995.*

* cited by examiner

*Primary Examiner*—Olik Chaudhari
*Assistant Examiner*—Fernando Toledo

(57) ABSTRACT

To address the above-discussed deficiencies of the prior art, the present invention provides an integrated circuit formed on a semiconductor wafer, comprising a doped base substrate; an insulator layer formed over the doped base substrate; and a doped ultra thin active layer formed on the insulator layer, the ultra thin active layer including a gate oxide, a gate formed on the gate oxide, and source and drain regions formed in the ultra thin active layer and adjacent the gate. The present invention therefore provides a semiconductor wafer that provides a doped ultra thin active layer. The lower Ioff in the DRAM transistor allows for lower heat dissipation, and the overall power requirement is decreased. Thus, the present invention provides a lower Ioff with reasonably good ion characteristics.

6 Claims, 2 Drawing Sheets

1

METHOD OF FABRICATING A SILICON ON INSULATOR TRANSISTOR STRUCTURE FOR IMBEDDED DRAM

CROSS-REFERENCE TO RELATED APPLICATION

The present invention is related to that disclosed in Ser. No. 60/115,843, filed on Jan. 13, 1999, entitled "SOI-BASED TR. STRUCTURE FOR EDRAM" and commonly assigned with the present invention.

TECHNICAL FIELD OF THE INVENTION

The present invention is directed, in general, to integrated circuit fabrication and, more specifically, to high-density DRAM applications in which the transistor device has a lowered transistor Ioff and a method of manufacture thereof.

BACKGROUND OF THE INVENTION

As is well known, dynamic random access memories (DRAMs) are so named because their cells can retain information only temporarily even with power continuously applied. The cells must therefore be read and refreshed at periodic intervals. Storage time is long enough to allow for many memory operations between refresh cycles. The advantages of cost per bit, device density, and flexibility of use have made DRAMs a widely used form of semiconductor memory.

The use of DRAM devices in integrated circuit designs has grown extensively over the years. Likewise, the density of the number of DRAM devices within certain integrated circuits has also increased substantially over the last few years. As device sizes have decreased, this has allowed manufacturers to increase the DRAM density even more. Along with the increase use of DRAM devices, however, a number of problems arose.

One such problem was the parasitic effect associated with operation of the DRAM device. Because of the smaller device size and the high operating currents due to large size of DRAM array, eddy currents would form within the P substrate. These eddy currents were highly undesirable because they caused the device to be inefficient. Furthermore, the eddy currents increased operating temperatures, which shortened the useful life of the device. To address this problem, manufactures inserted a buried oxide, which is often referred to as silicon on insulator (SOI). The SOI layer isolated the P-tub or N-tub from the substrate and thereby decreased the parasitic effect.

Although it has been found that the SOI somewhat decreases Ioff with some degree of success, the Ioff needs to be further reduced for the DRAM application. This high Ioff requirement in DRAMs can cause many problems related to heat transfer and hot carrier effects as well as more heat dissipation. Moreover, DRAMS are more temperature sensitive, and the increased temperature that accompanies larger current flows can damage the integrated circuit in which the DRAM device is located. Furthermore, a higher transistor Ioff can also lead to reduce the data storage time. This requires more frequent refresh-cycle time, resulting in a large power consumption.

There have been many attempts to reduce this excessively high Ioff. One such attempt calls for constructing a transistor without an n+ source and drain region. However, devices of this type are undesirable since they require a narrow process margin and additional masks. Moreover, leakage and degradation of transistor Ion may result. Another attempt has been to dope the SOI with n-type dopants. However, this has produced undesirable results in that the dopants caused leakage within the active layer. While these attempts have been directed to a lower transistor Ioff, this result is not always guaranteed. Many of the mentioned problems could be solved if a lower transistor Ioff in DRAMS is guaranteed.

Accordingly, what is needed in the art is a DRAM transistor that can be reliably manufactured, and a DRAM transistor that requires a lower transistor Ioff under a wide variety of process conditions. The present invention addresses this need.

SUMMARY OF THE INVENTION

To address the above-discussed deficiencies of the prior art, the present invention provides an integrated circuit formed on a semiconductor wafer, including a doped base substrate; an insulator layer formed over the doped base substrate; and a doped ultra thin active layer formed on the insulator layer. The ultra thin active layer includes a gate oxide, a gate formed on the gate oxide, and source and drain regions formed in the ultra thin active layer and adjacent the gate. Thicknesses of conventional active layers typically range from about 600 nm to about 800 nm, such that a low Ioff ranging from about $10^{-11}$ to about $10^{-12}$ can be achieved.

The ultra thin active layer employed in the present invention is substantially thinner than these conventional active layers. For example, in one particularly advantageous embodiment, the ultra thin active layer in the integrated circuit may have a thickness ranging from about 25 nm to about 10 nm with one preferably thickness being approximately 15 nm. However, other thicknesses of the ultra thin active layer may range from about 45 nm to about 30 nm.

The present invention therefore introduces the broad concept of an integrated circuit having a DRAM with an ultra thin active layer formed on a SOI layer in which a low Ioff can be achieved.

In one embodiment, the ultra thin active layer is doped with a P-type dopant and the source and drain regions are doped with an N-type dopant.

In one embodiment, the ultra thin active layer forms an active layer of a dynamic random access memory (DRAM) device. In one aspect of this particular embodiment, the DRAM device is a high density DRAM device.

In another embodiment, the insulator is a dielectric material such as silicon dioxide and has a thickness of at least about 0.5 μm. In yet another embodiment, the base substrate is a heavily doped substrate having a dopant concentration of at least about $10^{17}$ atoms/cm$^3$.

In yet another embodiment, the present invention discloses a method of fabricating an integrated circuit located on a semiconductor wafer, including: forming doped base substrate; forming an insulator layer over the doped base substrate; and forming a doped ultra thin active layer on the insulator layer. The ultra thin active layer includes a gate oxide, a gate formed on the gate oxide, and source and drain regions formed in the ultra thin active layer and adjacent the gate.

In yet another embodiment, the present invention discloses a high density dynamic random access memory (DRAM) device formed on a semiconductor wafer, including; a plurality of transistors; and a plurality of DRAM transistors, at least one of the DRAM transistors electrically connected to at least one of the plurality of transistors and at least one of the DRAM transistors including: a doped base substrate; an insulator layer formed over the doped base substrate; and a doped ultra thin active layer formed on the insulator layer. The ultra thin active layer includes a gate oxide, a gate formed on the gate oxide, and source and drain regions formed in the ultra thin active layer and adjacent the gate.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
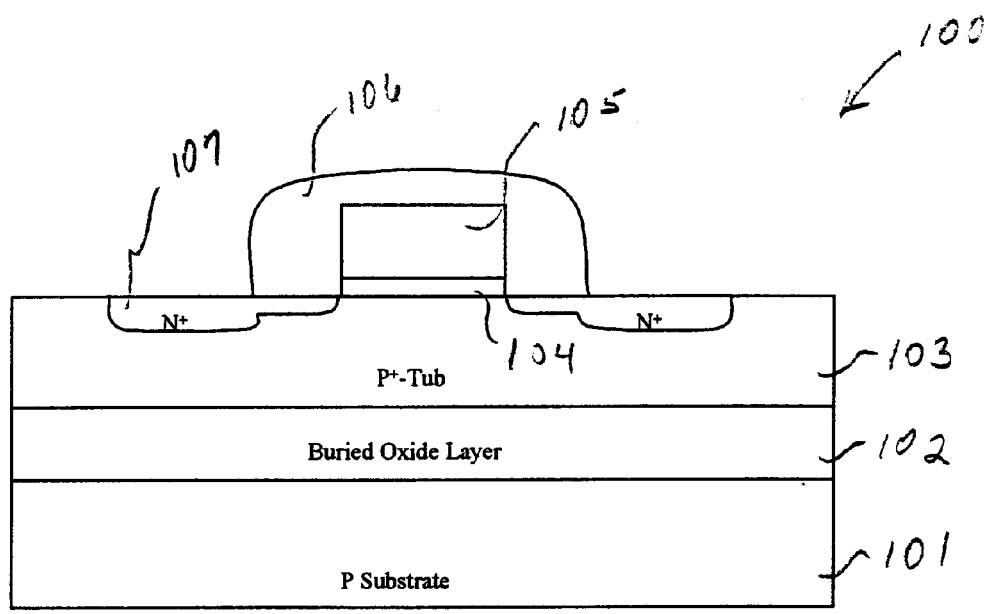
FIG. 1 illustrates a partial sectional view of a DRAM device in the prior art after the formation of gates and spacers.

Referring initially to FIG. 1, there is illustrated a partial sectional view of a semiconductor device 100 of the prior art. Semiconductor device 100 may contain a P substrate 101, a buried oxide layer 102 and an active region 103. Furthermore, semiconductor device 100 may contain a gate oxide 104, a gate 105, and an oxide spacer 106. The active region in a conventional semiconductor device ranges from about 60 nm to about 200 nm.

It is believed that the thickness of the active region induces an unreasonably high transistor Ioff in a semiconductor device. A high transistor Ioff in semiconductor devices causes many problems related to heat transfer and hot carrier effects as well as high heat dissipation. Furthermore, a higher transistor Ioff in semiconductor devices make the devices more temperature sensitive. More importantly, a higher transistor Ioff can lead to the inability to distinguish the "on" state from the "off" state when minimal bits are employed. Overall, a high transistor Ioff requires more power to operate conventional DRAMs and induces undesirable power-related effects within the semiconductor device.

The present invention calls for ultra thinning the active layer region in order to lower the transistor Ioff. A suggested explanation why the transistor Ioff decreases is that the active P-tub region is more easily depleted by the gate oxide and the buried oxide layer (silicon on insulator). Because the P-tub region is more easily depleted, leakage current is less likely to occur; therefore, less leakage current is added to the Ioff. Consequently, a lower Ioff is achieved in the device, and a lower standby current is achieved in the circuit. The present invention, therefore, provides a lower Ioff with reasonably good ion characteristics.

Figure 2:
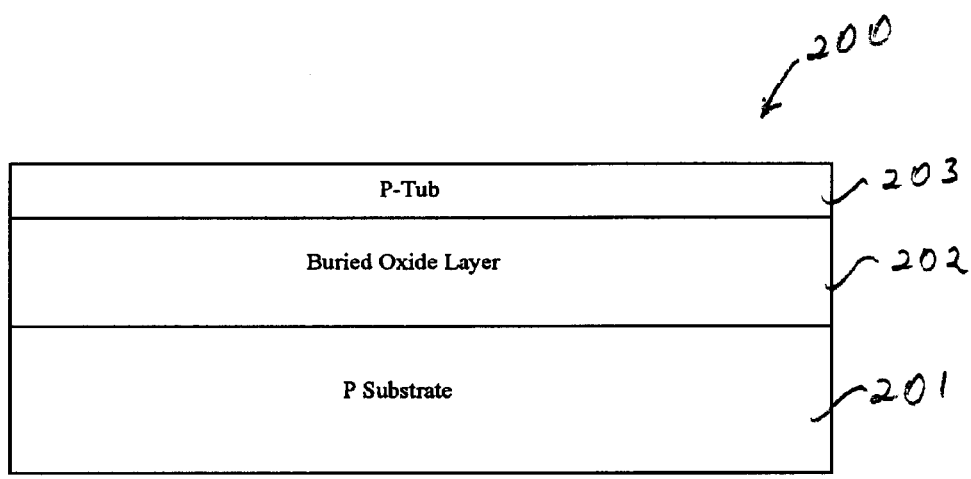
FIG. 2 illustrates a partial sectional view of the present invention's buried oxide layer and the present invention's ultra thin active layer.

In reference to FIG. 2, there is illustrated a partial sectional view of a semiconductor device 200 of the present invention in an intermediate fabrication step. In this particular embodiment, the semiconductor device 200 comprises a heavily doped P substrate layer 201 (e.g., a dopant concentration of at least about $10^{17}$ atoms/cm$^3$), a buried oxide layer 202 and an ultra thin active layer 203, respectively, formed thereon in a conventional manner. While p-type dopants are specifically discussed herein, it should be understood that other dopant types may also be used. For example, the substrate may be a heavily doped N substrate. The substrate may comprise silicon, germanium, or other presently known or later-discovered materials that are suitable for the manufacture of such semiconductor devices.

In one advantageous embodiment, the buried oxide layer 202, which is an insulator formed with a dielectric material such as silicon dioxide. Preferably, the buried oxide layer 202 is a good quality oxide having has a thickness that ranges from about 0.25 $\mu$m to about 1.0 $\mu$m. A more preferred thickness is at least about 0.5 $\mu$m. The substrate is preferably a heavily doped substrate having a dopant concentration of at least about $10^{17}$ atoms/cm$^3$.

In one advantageous embodiment, the ultra thin active layer 203 has a thickness ranging from about 10 nm to about 25 nm, which is deposited by conventional processes. A preferable thickness of the active layer 203 is approximately 15 nm. The active layer may comprise silicon, germanium, or other presently known or later-discovered materials that are suitable for the active layer. It is believed that by thinning the active layer 203, there are collectively fewer electron holes within the active layer 203; thus, the active layer 203 more easily depleted by the buried oxide layer 202. Because the active layer 203 is more depleted, the active layer 203 does not have an abundance of charge. Therefore, tunneling from the source to the drain 307 within the P-tub region 203 is substantially inhibited and current is not significantly added to the transistor Ioff. In a more advantageous embodiment, the ultra thin active layer 203 forms an active layer of a dynamic random access memory (DRAM) device. Such as a high density DRAM device. In one such device, the ultra thin active layer 203 is doped with a P-type dopant and the source and drain regions are doped with an N-type dopant. Given the similar structures between the NMOS and the semiconductor devices covered by the present invention, it is apparent that the same results could be expected in semiconductor devices as appears in the NMOS devices, as well as CMOS Ioff.

Figure 3:
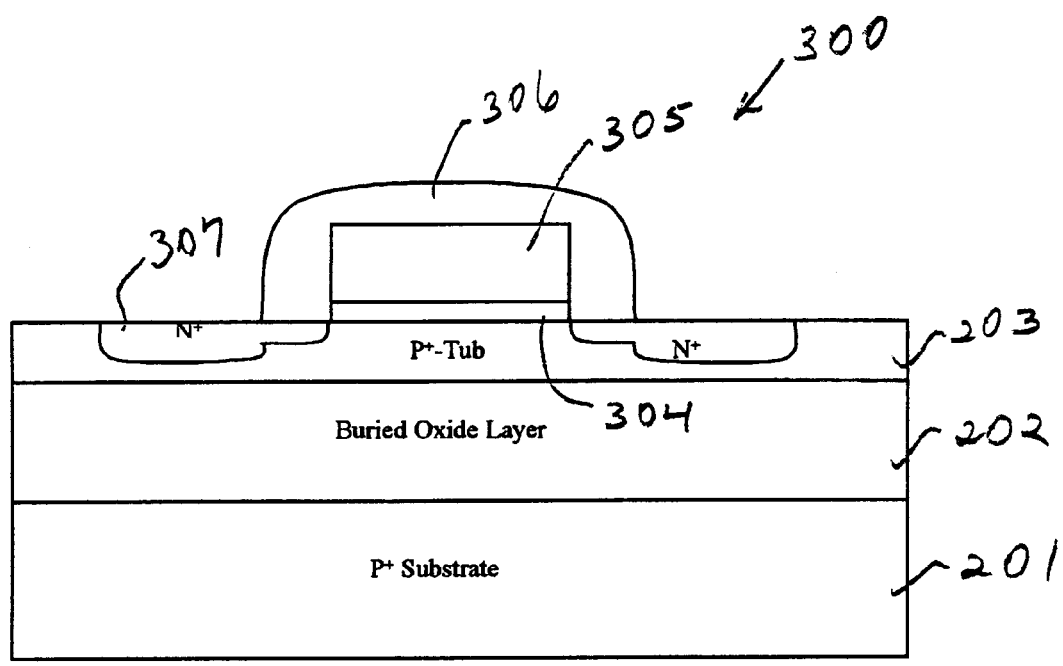
FIG. 3 illustrates a partial sectional view of the present invention after the formation of source and drain, gates and spacers.

FIG. 3 illustrates a partial sectional view of a semiconductor device 300 of the present invention after the formation of a doped base substrate 201, an insulator layer 302 formed over the doped base substrate 201, and a doped ultra thin active layer 203 formed on the insulator layer 202. The ultra thin active layer 203 includes a gate oxide 304, a gate 305 formed on the gate oxide 304, and source and drain regions 307 formed in the ultra thin active layer 203 and adjacent the gate 305. The source and drain region 307, the gate oxide 304, a gate 305, and the oxide spacer 306 are formed by conventional means. Note that the figures illustrated are only partial sectional views of a semiconductor device, and one skilled in the art recognizes that the structure of a semiconductor device varies considerably.

Also illustrated in FIG. 3 is a polysilicon structure that has been deposited, doped and etched using conventional processes to form a gate 305. The gate 305 is formed over a gate oxide 304. The semiconductor structure 300 may also include spacers 306 or gate side-walls that are formed around the gate 305. The process of forming the spacers 306 are well known. The substrate 301, buried oxide layer 202, P-tub region 203, gate 305, gate oxide 304 and spacers 306 provide the resulting structure that is representative of a foundational level of semiconductor structures having a significantly lower Ioff.

Although the present invention has been described in detail, those skilled in the art should understand that they can make various changes, substitutions and alterations herein without departing from the spirit and scope of the invention in its broadest form.

What is claimed is:

1. A method of fabricating an integrated circuit located on a semiconductor wafer, comprising:

forming a doped base substrate;

forming an insulator layer on the doped base substrate; and forming a doped ultra thin active layer on the insulator layer to a thickness ranging from about 10 nm to about 15 nm, the ultra thin active layer including a gate oxide, a gate formed on the gate oxide wherein a width of the gate oxide is coextensive with a width of the gate, and source and drain regions formed in the ultra thin active layer and adjacent the gate.

2. The method as recited in claim 1 wherein forming an ultra thin active layer includes forming an active layer of a dynamic random access memory (DRAM) device.

3. The method as recited in claim 2 wherein forming an active layer of a DRAM device includes forming a high density DRAM device.

4. The method as recited in claim 1 wherein forming an ultra thin active layer includes doping the ultra thin active layer with a P-type dopant and doping the source and drain regions with an N-type dopant.

5. The method as recited in claim 1 wherein forming an insulator includes forming a silicon dioxide layer to a thickness of at least about 0.5 $\mu$m.

6. The method as recited in claim 1 wherein forming a base substrate includes forming a heavily doped substrate having a dopant concentration of at least about $10^{17}$ atoms/cm$^3$.

* * * * *